United States Patent
Salome et al.

(10) Patent No.: US 6,694,166 B2
(45) Date of Patent: Feb. 17, 2004

(54) MAGNETIC RESONANCE METHOD

(75) Inventors: Ryf Salome, Zurich (CH); Marcus Alexander Spiegel, Berneck (CH); Oliver Michael Weber, Zurich (CH); Peter Boesiger, Ennetbaden (CH)

(73) Assignee: Koninklijke Philips Electronics N.V., Eindhoven (NL)

( * ) Notice: Subject to any disclaimer, the term of this patent is extended or adjusted under 35 U.S.C. 154(b) by 144 days.

(21) Appl. No.: 10/129,740

(22) PCT Filed: Sep. 11, 2001

(86) PCT No.: PCT/EP01/10451
§ 371 (c)(1),
(2), (4) Date: May 10, 2002

(87) PCT Pub. No.: WO02/23211
PCT Pub. Date: Mar. 21, 2002

(65) Prior Publication Data
US 2002/0165446 A1 Nov. 7, 2002

(30) Foreign Application Priority Data
Sep. 12, 2000 (EP) .............................. 00203142

(51) Int. Cl.$^7$ .................................. A61B 5/05
(52) U.S. Cl. ............... 600/410; 600/419; 382/128; 382/130; 324/307; 324/309; 324/310; 324/313; 324/318
(58) Field of Search .................. 600/407, 410, 600/419, 481, 508; 382/128, 130; 324/307, 309, 310, 313, 318

(56) References Cited

U.S. PATENT DOCUMENTS

| 5,111,820 A | | 5/1992 | Axel et al. |
| 5,379,766 A | * | 1/1995 | McKinnon et al. ......... 600/413 |
| 5,474,067 A | * | 12/1995 | Laub ..................... 600/413 |
| 6,597,935 B2 | * | 7/2003 | Prince et al. ............. 600/410 |

FOREIGN PATENT DOCUMENTS

EP  0 507 392  10/1992

OTHER PUBLICATIONS

S.E. Fischer, G.C. McKinnon, S.E. Maier, P. Boesiger; "Improved Myocardial Tagging Contrast"; MRM; 30:191–2000 (1993).
J. Park, et al.; "Deformable Models with Parameter Functions for Left Ventricle 3–D Wall Motion Analysis and Visualization"; Computers in Cardiology; 1995, Vienna, Austria, Sep. 10, 1995, pp. 241–244.
L. Axel, L. Dougherty; "Heart Wall Motion: Improved Method of Spatial Modulation of Magnetization For MR Imaging", Radiology, vol. 172, pp. 349–350.

* cited by examiner

*Primary Examiner*—Elenimantis Mercader
*Assistant Examiner*—Jeoyuh Lin
(74) *Attorney, Agent, or Firm*—Thomas M. Lundin, Esq.

(57) ABSTRACT

A magnetic resonance method is described for forming a fast dynamic image with an automatically generated grid of essentially orthogonally arranged grid lines by a saturation information induced over the object to be imaged. Therefore a first set of parallel saturation planes is obtained by applying a first nonselective RF pulse with a flip angle of 90°, an intermediate magnetic field gradient pulse in direction of the spatial modulation, and a second nonselective RF pulse with a flip angle of 90°. A subsequent spoiler gradient pulse is applied in the direction of the magnetic field gradient for slice selection. Subsequently a second set of parallel saturation planes is obtained in the same manner by inverting one second RF pulse with respect to the first RF pulse. Further the first and the sets of saturation planes are subtracted from each other to obtain a grid free of any contribution of relaxation components of magnetization. A tagging grid in three dimensions is provided by obtaining sets of parallel saturation planes in all three spatial directions, whereas the strengths of the spoiler gradient pulses in the three dimensions are different to each other.

10 Claims, 6 Drawing Sheets

MAGNETIC RESONANCE METHOD

BACKGROUND

The invention relates to a magnetic resonance method for forming a fast dynamic image with an automatically generated grid of essentially orthogonally arranged grid lines by a saturation information induced over the object to be imaged, according to the preamble of claim 1.

Analysis of myocardial motion is essential for the understanding of the heart mechanics and consequently, the estimation of the heart condition for instance after acute myocardial infarction. Myocardial tagging enables to assess accurately tissue deformations. However, conventional tagging sequences such as "SPAMM", which is described in the article of L. Axel and L. Dougherty in Radiology 1989; 171, pages 841–845, or "CSPAMM", described in the article of S. E. Fischer et. al. in Magnetic Resonance in Medicine 30: pages 191–200 (1993), allow for registration of the spatial displacement of the myocardium mere as a two dimensional projection. Thus, analysis of the effective three-dimensional (3D) motion trajectories is only possible in a limited way. Former methods of 3D motion tracking combine for example 2D tagged short axis views with 2D tagged long axis views or with a 1D velocity map.

The disadvantages of these known methods are the time-consuming and demanding planning procedure, as well as the difficult matching of the 2D images to a 3D data set.

SUMMARY

It is an object of the present invention to overcome the limitations of the known 2D tagging methods.

This object has been solved by a method as claimed in claim 1.

These and further advantages of the invention are disclosed in the dependent claims and in the following description in which an exemplified embodiment of the invention is described with respect to the accompanying drawings. Therein

DRAWINGS

Figure 3:
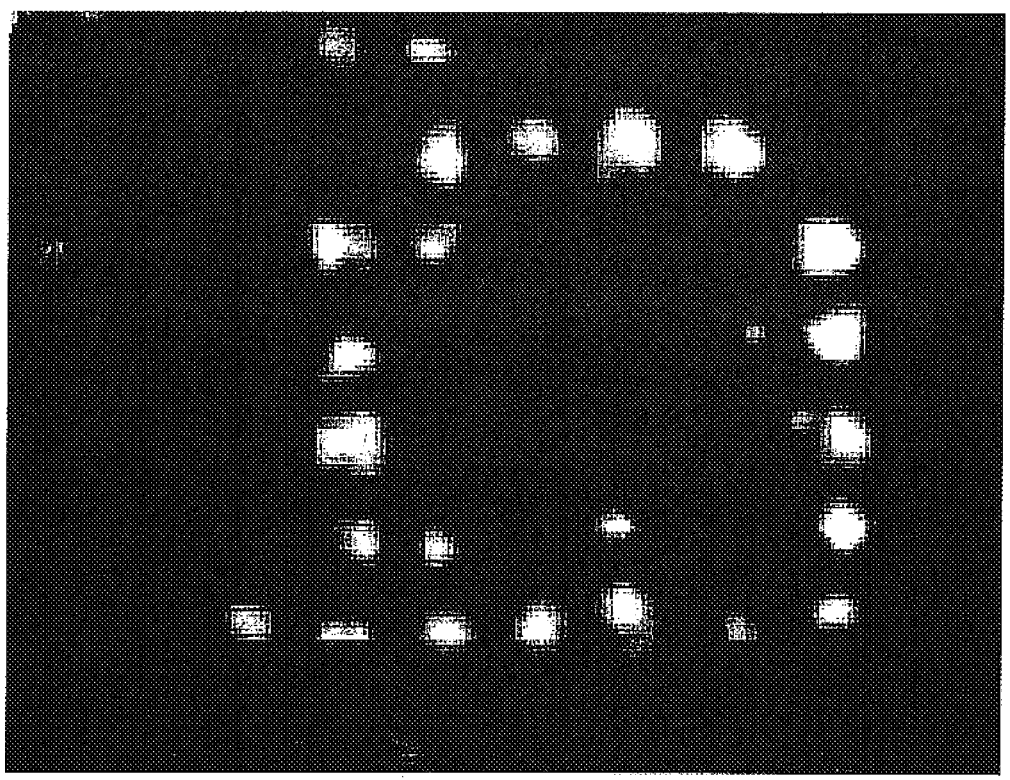
Figure 4:
Figure 5:
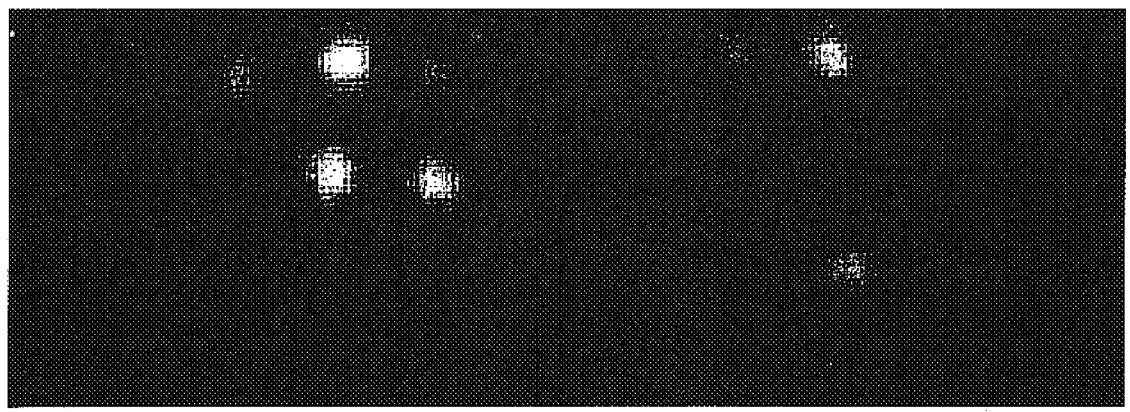
Figure 6:
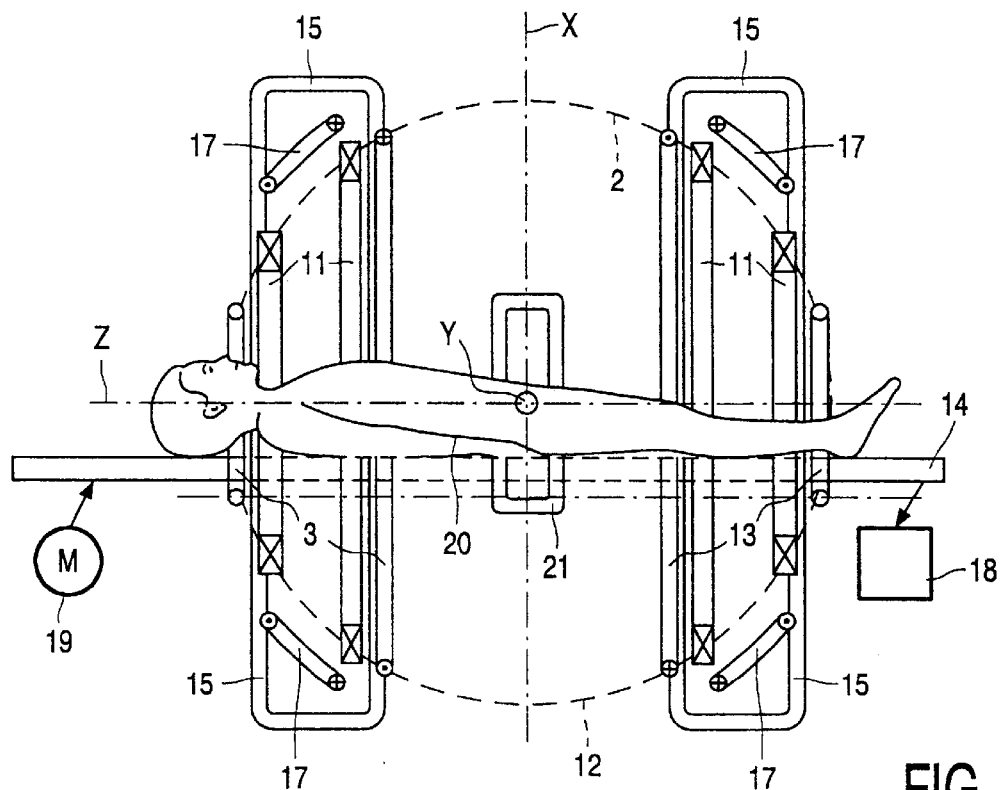
Figure 7:
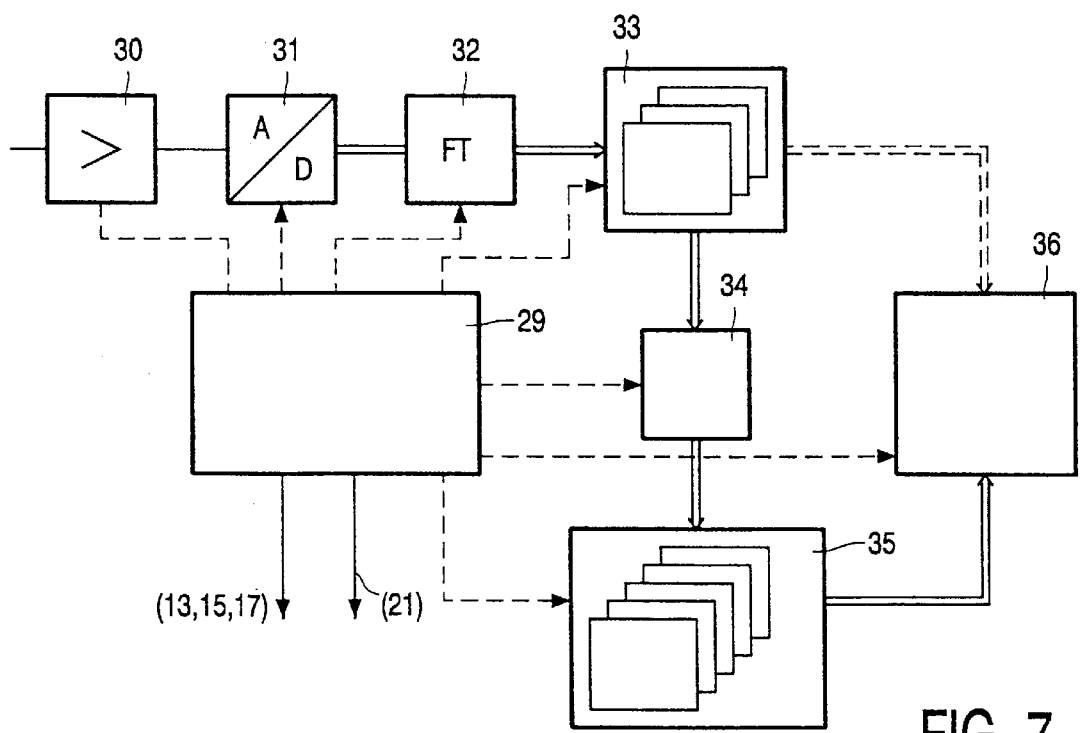

FIG. 3 shows a 3D tagging pattern in vivo in a short axis view in the X-Y plane, FIG. 4 shows the same 3D tagging pattern in a long axis view in the X-Z plane, FIG. 5 shows the same 3D tagging pattern in a long axis view in the Y-Z plane, FIG. 6 shows an apparatus for carrying out the method in accordance with the present invention, and FIG. 7 shows a circuit diagram of the apparatus as shown in FIG. 6.

DESCRIPTION

Figure 1:
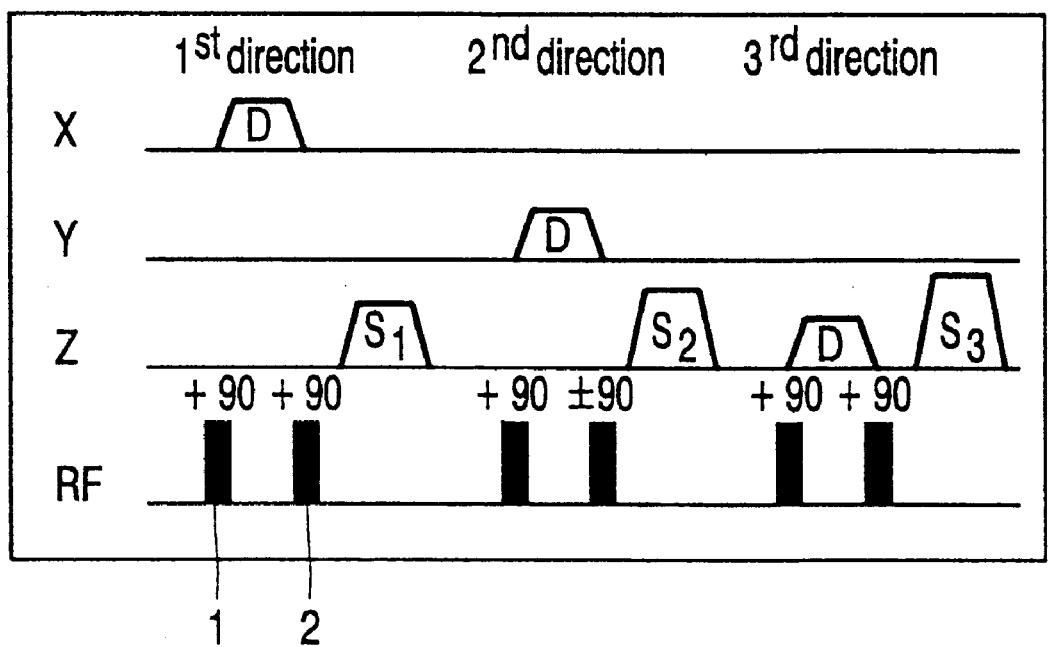
FIG. 1 shows a tagging sequence in three dimensions.

The tagging preparation method according to the present invention is based on the subtraction of two images with complementary signed tagging modulation. The tagging grid is thereby obtained by a saturation information induced over the object to be imaged. It prevents tagline intensity fading and consequently allows observing the heart motion throughout the whole heart cycle. Two 90° block RF pulses 1 and 2 are interspersed by a dephasing gradient D, which produce a sinusoidal modulation of the z-magnetization and thus a line shaped tag pattern, i.e. a set of parallel saturation planes. To generate a three-dimensional tagging lattice the modulation is repeated in all three spatial directions, i.e. in X-direction, Y-direction and Z-direction. Each modulation is followed by a spoiler gradient $S_1$, $S_2$ and $S_3$, each of a different size, in order to destroy remaining transversal magnetization and to avoid phase coherence effects. As can be seen in FIG. 1 the spoiler gradient $S_2$ is stronger than the spoiler gradient $S_1$ and the spoiler gradient $S_3$ is stronger than the spoiler gradient $S_2$. A tagline distance of 10 mm is chosen. The whole tagging preparation takes 7.6 ms. In order to obtain the complementary spatial modulation of magnetization (CSPAMM) the second RF pulse of the Y-direction is inverted. Further details of the CSPAMM method can be obtained from above mentioned article of S. E. Fischer et. al. which contents is included by reference.

After tagging preparation a 3D flow compensated, interleaved gradient EPI sequence with EPI factor=9, flip angle=16° and TE=7.1 ms is used for imaging. A volume of 256×256×40 mm³ is imaged with a spatial resolution of 2.0×2.0×2.0 mm³. Sixteen heart phases are achieved with a frame to frame resolution of 35 ms. To avoid respiratory motion the scan duration is split into 10 s breath holds. In order to guarantee the same diaphragm position throughout the whole scan, a navigator guided breath hold technique was introduced. For this reason the excursion of the diaphragm is tracked in real time with a resolution of 100 ms, which allows the operator to guide the subject or individual to hold his breath at the correct position. During the breath hold navigator gating is applied. All measurements were performed on a Philips Gyroscan ACS/NT with 1.5 Tesla whole body scanner equipped with a gradient system known as "PowerTrack 6000".

Figure 2:
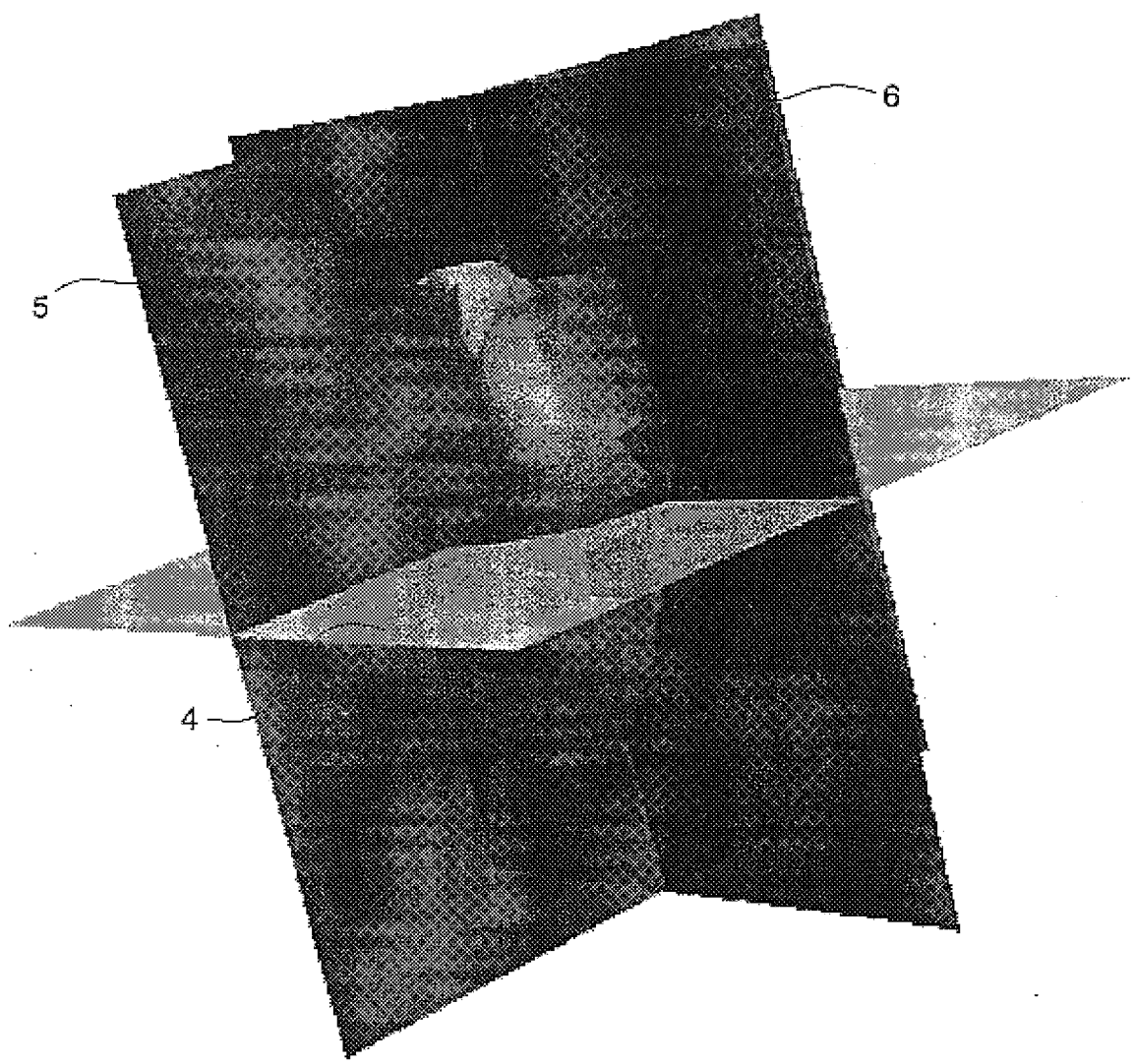
FIG. 2 shows a model of the heart with three orthogonal sections.

An example of the 3D tagging measurements is shown in FIGS. 3 to 5, in which the saturation lattice and its deformation during the heart contraction can be observed in vivo. In FIG. 2 a model of the heart with three orthogonal sections, i.e. the X-Y or horizontal plane, the X-Z plane and the Y-Z plane, is shown. In FIG. 3 a 3D tagging pattern in vivo with a grid spacing of 10 mm in a short axis view in X-Y plane, in FIG. 4 the same pattern in a long axis projection in the X-Z plane and in FIG. 5 the same pattern in the Y-Z plane are shown. The 3D tagging measurements were accomplished successfully in phantom and with 10 healthy volunteers, in order to show the feasibility of the aforementioned method.

The apparatus shown in FIG. 6 is an MR apparatus which comprises a system of four coils 11 for generating a steady, uniform magnetic field whose strength is of the order of magnitude of from some tenths of Tesla to some Tesla. The coils 11, being concentrically arranged relative to the z axis, may be provided on a spherical surface 12. The patient 20 to be examined is arranged on a table 14 which is positioned inside these coils. In order to produce a magnetic field which extends in the z direction and linearly varies in this direction (which field is also referred to hereinafter as the gradient field), four coils 13 are provided on the spherical surface 12. Also present are four coils 17 which generate a gradient field which also extends (vertically) in the x direction. A magnetic gradient field extending in the z direction and having a gradient in the y direction (perpendicularly to the plane of the drawing of FIG. 6) is generated by four coils 15 which may be identical to the coils 17 but are arranged so as to be offset 90° in space with respect thereto. Only two of these four coils are shown in FIG. 6.

Because each of the three coil systems 13, 15, and 17 for generating the magnetic gradient fields is symmetrically arranged relative to the spherical surface, the field strength at the center of the sphere is determined exclusively by the steady, uniform magnetic field of the coil 11. Also provided is an RF coil 21 which generates an essentially uniform RF magnetic field which extends perpendicularly to the direction of the steady, uniform magnetic field (i.e. perpendicularly to the z direction). The RF coil receives an RF modulated current from an RF generator during each RF pulse The RF coil 21 can also be used for receiving the spin resonance signals generated in the examination zone.

As is shown in FIG. 7, the MR signals received in the MR apparatus are amplified by a unit 30 and transposed in the baseband. The analog signal thus obtained is converted into a sequence of digital values by an analog-to-digital converter 31: The analog-to-digital converter 31 is controlled by a control unit 29 so that it generates digital data words only during the read-out phase. The analog-to-digital converter 31 is succeeded by a Fourier transformation unit 32 which performs a one-dimensional Fourier transformation over the sequence of sampling values obtained by digitization of an MR signal, execution being so fast that the Fourier transformation is terminated before the next MR signal is received.

The raw data thus produced by Fourier transformation is written into a memory 33 whose storage capacity suffices for the storage of several sets of raw data. From these sets of raw data a composition unit 34 generates a composite image in the described manner, this composite image is stored in a memory 35 whose storage capacity suffices for the storage of a large number of successive composite images 10. These sets of data are calculated for different instants, the spacing of which is preferably small in comparison with the measurement period required for the acquisition of a set of data. A reconstruction unit 36, performing a composition of the subsequent images, produces MR images from the sets of data thus acquired, said MR images being stored. The MR images represent the examination zone at the predetermined instants. The series of the MR images thus obtained from the data suitably reproduces the dynamic processes in the examination zone.

The units 30 to 36 are controlled by the control unit 29. As denoted by the downwards pointing arrows, the control unit also imposes the variation in time of the currents in the gradient coil systems 13, 15 and 17 as well as the central frequency, the bandwidth and the envelope of the RF pulses generated by the RF coil 21. The memories 33 and 35 as well as the MR image memory (not shown) in the reconstruction unit 36 can be realized by way of a single memory of adequate capacity. The Fourier transformation unit 32, the composition unit 34 and the reconstruction unit 36 can be realized by way of a data processor well-suited for running a computer program according the above-mentioned method.

What is claimed is:

1. Magnetic resonance method for forming a fast dynamic image with an automatically generated grid of essentially orthogonally arranged grid lines by a saturation information induced over the object to be imaged, wherein
    a first set of parallel saturation planes is obtained by applying
        a first nonselective RF pulse with a flip angle of 90°,
        an intermediate magnetic field gradient pulse in direction of the spatial modulation,
        a second nonselective RF pulse with a flip angle of 90°,
        a subsequent spoiler gradient pulse in the direction of the magnetic field gradient for slice selection, and
    a second set of parallel saturation planes is obtained in the same manner by inverting one second RF pulse in one of the orthogonal directions with respect to the first RF pulse, and
    the first and the saturation planes are subtracted from each other to obtain a grid free of any contribution of relaxation components of magnetization, wherein
    a tagging grid in three dimensions is provided by obtaining sets of parallel saturation planes in all three spatial directions, whereas the strengths of the spoiler gradient pulses in the three dimensions are different to each other.

2. Magnetic resonance method according to claim 1, wherein the strength of the first spoiler gradient is smaller than the strength of the second spoiler gradient and the strength of the second spoiler gradient is smaller than the strength of the third spoiler gradient.

3. Magnetic resonance method according to claim 2, wherein the strength of the second spoiler gradient pulse is essentially twice the strength of the first spoiler gradient pulse and the strength of the third spoiler gradient pulse is essentially thrice the strength of the first gradient pulse.

4. Magnetic resonance method according to claim 1 wherein the second RF pulse of the second dimension is inverted in order to obtain a complementary spatial modulation of magnetization.

5. Magnetic resonance method according to claim 1 wherein after tagging preparation the image is formed by echo planar imaging.

6. Magnetic resonance method according to claim 5, wherein the echo planar imaging is applied as a three-dimensional flow compensated, interleaved gradient sequence.

7. Magnetic resonance method according to claim 1 wherein the heart motion of an individual is investigated and the breathing motion of the individual is held during scanning, in order to avoid image artefacts induced by breathing.

8. Magnetic resonance method according to claim 7, wherein the breathing motion is navigated by observing the diaphragm position of the individual and that breathing motion is held at the same diaphragm position for subsequent scans.

9. A magnetic resonance imaging apparatus for obtaining a fast dynamic image with an automatic grid of essentially orthogonally arranged grid lines by a tagging information induced over the object to be imaged, comprising:
    means for obtaining a first tagging grid of orthogonal grid lines which means applies for each grid line:
        a first nonselective RF pulse with a predetermined flip angle;
        an intermediate magnetic field gradient pulse in direction of the spatial modulation;
        a second nonselective RF pulse with a predetermined flip angle;
        a subsequent spoiler gradient pulse in the direction of the magnetic field gradient for slice selection, used for imaging of the object; and
    means for obtaining a second orthogonal tagging grid in the same manner by inverting one second RF pulse in one of the orthogonal directions with respect to the first RF pulse and
    means for subtracting the first and the second tagging grids from each other to obtain a grid free of any contribution of relaxation components of magnetization;

wherein a means is provided for producing a tagging grid in three dimensions by obtaining tagging lines in three directions, whereas the heights of the spoiler gradient pulses in the three dimensions are different to each other.

10. A computer program product stored on a computer usable medium for forming a fast dynamic image with an automatic grid of essentially orthogonally arranged grid lines by means of the magnetic resonance method, comprising a computer readable program means for causing the computer to control the execution of:

a procedure for tagging information induced over the object to be imaged, whereas a first tagging grid of orthogonal grid lines is obtained by applying for each grid line a first nonselective RF pulse with a predetermined flip angle, an intermediate magnetic field gradient pulse in direction of the spatial modulation, a second nonselective RF pulse with a predetermined flip angle, a subsequent spoiler gradient pulse in the direction of the magnetic field gradient for slice selection, used for imaging of the object, and a procedure for obtaining a second orthogonal tagging grid in the same manner by inverting one second RF pulse in one of the orthogonal directions with respect to the first RF pulse, and a procedure for subtracting the first and the second tagging grids from each other to obtain a grid free of any contribution of relaxation components of magnetization, wherein there is provided a procedure for producing a tagging grid with tagging lines in three dimensions, whereas the heights of the spoiler gradient pulses in the three dimensions are different to each other.

* * * * *